(12) United States Patent
Kasai

(10) Patent No.: US 6,624,514 B2
(45) Date of Patent: Sep. 23, 2003

(54) SEMICONDUCTOR DEVICE AND MANUFACTURING METHOD THEREOF

(75) Inventor: Kunihiro Kasai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/001,803

(22) Filed: Dec. 5, 2001

(65) Prior Publication Data

US 2002/0084526 A1 Jul. 4, 2002

(30) Foreign Application Priority Data

Dec. 6, 2000 (JP) ........................................ 2000-371011

(51) Int. Cl.[7] .............................................. H01L 23/48
(52) U.S. Cl. ................... 257/758; 257/701; 257/750; 257/751; 257/768; 257/769; 257/773; 257/774; 257/775
(58) Field of Search ................................ 257/701, 702, 257/750, 751, 754, 757, 758, 762, 765, 768, 769, 771, 773, 774, 775

(56) References Cited

U.S. PATENT DOCUMENTS

| | | | |
|---|---|---|---|
| 5,877,075 A | * | 3/1999 | Dai et al. .................... 438/597 |
| 6,008,084 A | | 12/1999 | Sung |
| 6,100,177 A | | 8/2000 | Noguchi |
| 6,124,638 A | * | 9/2000 | Iwasa .......................... 257/751 |
| 6,177,347 B1 | * | 1/2001 | Liu et al. ..................... 438/675 |
| 6,417,116 B2 | * | 7/2002 | Kudo et al. .................. 438/780 |
| 2002/0027287 A1 | * | 3/2002 | Takagi et al. ................ 257/758 |

* cited by examiner

Primary Examiner—Nathan J. Flynn
Assistant Examiner—Pershelle Greene
(74) Attorney, Agent, or Firm—Oblon, Spivak, McClelland, Maier & Neustadt, P.C.

(57) ABSTRACT

A semiconductor device includes a middle inter-level insulating film disposed on or above a semiconductor substrate, a conductive layer disposed on the middle inter-level insulating film, and an upper inter-level insulating film disposed on the middle inter-level insulating film and the conductive layer. The upper inter-level insulating film includes first, second, and third wiring grooves distant from each other. The second and third wiring grooves use the conductive layer as their bottoms. The side surfaces of the first, second, and third wiring grooves are covered with in-groove barrier layers. First, second, and third wiring layers are buried in the first, second, and third wiring grooves. The first, second, and third wiring layers are derived from the same wiring film, and have a thickness larger than that of the conductive layer. The second and third wiring layers are electrically connected to the conductive layer.

23 Claims, 12 Drawing Sheets

SEMICONDUCTOR DEVICE AND MANUFACTURING METHOD THEREOF

CROSS-REFERENCE TO RELATED APPLICATIONS

This application is based upon and claims the benefit of priority from the prior Japanese Patent Application No. 2000-371011, Dec. 6, 2000, the entire contents of which are incorporated herein by reference.

BACKGROUND OF THE INVENTION

1. Field of the Invention

The present invention relates to a semiconductor device and manufacturing method thereof, and particularly to a semiconductor device having a wiring structure formed by a buried wiring technique, and manufacturing method thereof.

2. Description of the Related Art

Jpn. Pat. Appln. KOKAI Publication No. 2000-77407 discloses an example of a semiconductor device and manufacturing method thereof, using a conventional "buried wiring" (which can be referred to as a metal damascene wiring) technique. In this example, wiring portions having different thicknesses are suitably disposed in accordance with relationships relative to neighboring wiring and so forth, to reduce wiring resistance or inter-wiring capacitance.

BRIEF SUMMARY OF THE INVENTION

According to a first aspect of the present invention, there is provided a semiconductor device comprising:

a semiconductor substrate;

a middle inter-level insulating film disposed on or above the semiconductor substrate;

a conductive layer disposed on the middle inter-level insulating film;

an upper inter-level insulating film disposed on the middle inter-level insulating film and the conductive layer, the upper inter-level insulating film including first, second, and third wiring grooves distant from each other, the second and third wiring grooves using the conductive layer as their bottoms;

in-groove barrier layers covering side surfaces of the first, second, and third wiring grooves; and first, second, and third wiring layers buried in the first, second, and third wiring grooves, the first, second, and third wiring layers being derived from the same wiring film, the first, second, and third wiring layers having a thickness larger than that of the conductive layer, the second and third wiring layers being electrically connected to the conductive layer.

According to a second aspect of the present invention, there is provided a method of manufacturing a semiconductor device, comprising:

forming a lower wiring layer on a lower inter-level insulating film disposed on or above a semiconductor substrate;

forming an inter-level barrier layer on the lower inter-level insulating film and the lower wiring layer;

forming a middle inter-level insulating film on the inter-level barrier layer;

forming a conductive film on the middle inter-level insulating film;

patterning the conductive film by photo-lithography to form a conductive layer having a predetermined pattern from the conductive film;

forming an upper inter-level insulating film on the middle inter-level insulating film and the conductive layer;

patterning the upper inter-level insulating film by photo-lithography to form first, second, and third wiring grooves distant from each other in the upper inter-level insulating film, the second and third wiring grooves using the conductive layer as their bottoms;

forming a via-hole extending from the first wiring groove to the lower wiring layer in the middle inter-level insulating film and the inter-level barrier layer, forming a barrier film to cover a region including the via-hole, the first, second, and third wiring grooves;

forming a wiring film on the barrier film to fill the via-hole, the first, second, and third wiring grooves; and planarizing a resultant structure with the wiring film thus formed, by chemical mechanical polishing, to partly remove the barrier film and the wiring film until the upper inter-level insulating film is exposed, and to leave via-plug, first, second, and third wiring layers in the via-hole, the first, second, and third wiring grooves, respectively.

DETAILED DESCRIPTION OF THE INVENTION

Figure 1:
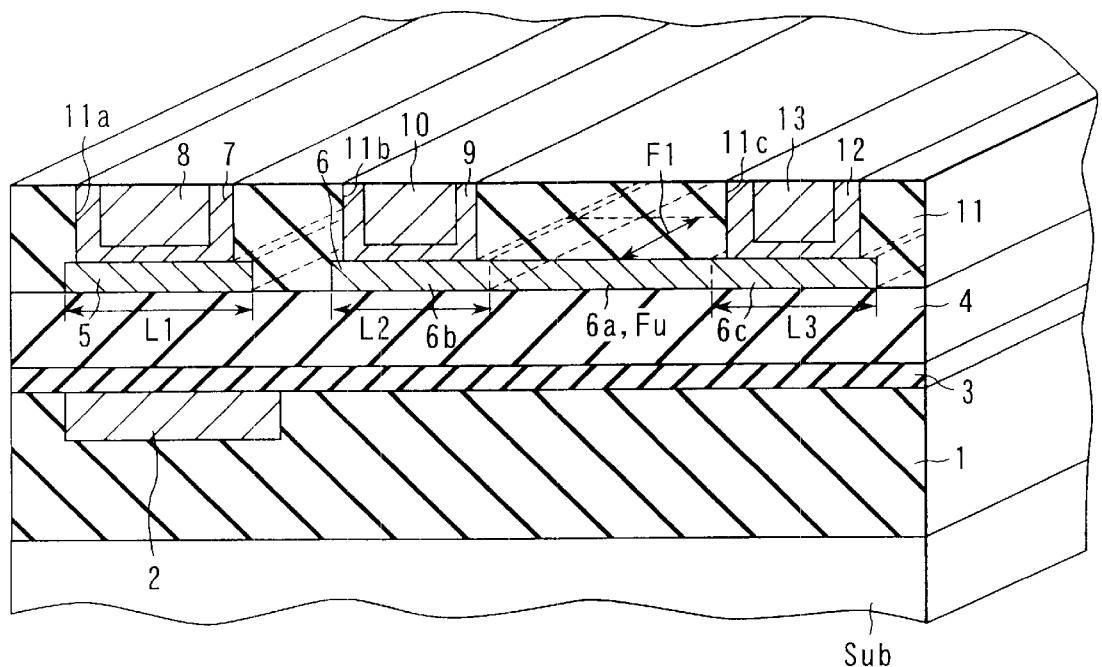
FIG. 1 is a sectional perspective view showing a semiconductor device according to a first embodiment of the present invention.

Embodiments of the present invention will be described hereinafter with reference to the accompanying drawings. In the following description, the constituent elements having substantially the same function and arrangement are denoted by the same reference numerals, and a repetitive description will be made only when necessary. The drawings schematically show the relationship between the thicknesses and planar sizes of layers, the ratio of the thicknesses, and so forth, differently from actualities. Accordingly, the actual thicknesses and planar sizes of layers should be determined with reference to the following descriptions. Furthermore, the relationship between the thicknesses and planar sizes of layers, the ratio of the thicknesses, and so forth are not shown equally in all the drawings.

First Embodiment

FIG. 1 is a sectional perspective view showing a semiconductor device according to a first embodiment of the present invention. As shown in FIG. 1, a lower inter-level insulating film 1 is formed on a semiconductor substrate Sub. A lower wiring layer 2 made of copper or aluminum is formed on the lower inter-level insulating film 1. The lower wiring layer 2 is utilized for a general signal line. The lower wiring layer 2 has a film thickness of about 0.5 $\mu$m.

An insulating inter-level barrier layer 3 made of, e.g., silicon nitride and to be used as an etching stopper is formed on the lower wiring layer 2 and the lower inter-level insulating film 1. The inter-level barrier layer 3 has a film thickness of from about 0.1 to 0.15 $\mu$m. The inter-level barrier layer 3 is made of a material, which has an etching selectivity or priority relative to $SiO_2$.

A middle inter-level insulating film 4 having a film thickness of about 1 $\mu$m is formed on the inter-level barrier layer 3. Conductive layers 5 and 6 are formed on the middle inter-level insulating film 4, and are distant from each other. An upper inter-level insulating film 11 is formed on the middle inter-level insulating film 4 and the conductive layers 5 and 6. The lower inter-level insulating film 1, middle inter-level insulating film 4 and upper inter-level insulating film 11 are made of $SiO_2$, such as a TEOS film.

The conductive layers 5 and 6 mutually have the same thickness, which falls in a range of from about 0.02 to 0.05 $\mu$m, which is smaller than that of the lower wiring layer 2. The conductive layers 5 and 6 are made of a material selected from the group consisting of refractory metals and nitrides of refractory metals, such as Ta or a nitride thereof. The conductive layer 5 is formed as an ordinary wiring pattern portion having a width L1 of about 1 $\mu$m. The conductive layer 6 has a bridge portion 6a forming a fuse Fu which has a width F1 of about 1 $\mu$m, and two wiring pattern portions 6b and 6c which have widths L2 and L3 of about 1 $\mu$m and are connected to each other via the bridge portion 6a. The fuse Fu is arranged such that it is melted and cut by a laser beam radiated through the upper inter-level insulating film 11. Refractory metals and their nitrides have a resistivity higher than copper or aluminum, and thus are suitable for the fuse Fu, through which no ordinary operation signal is transmitted.

In the upper inter-level insulating film 11, first, second, and third wiring grooves 11a, 11b, and 11c are formed to be distant from each other. The first, second, and third wiring grooves 11a, 11b, and 11c use, as their bottoms, the conductive layer 5, the wiring pattern portion 6b of the conductive layer 6, and the wiring pattern portion 6c of the conductive layer 6, respectively. The side surfaces of the first, second, and third wiring grooves 11a, 11b, and 11c are covered with in-groove barrier layers 7, 9, and 12, respectively, which are thinner than the conductive layers 5 and 6. The in-groove barrier layers 7, 9, and 12 are made of a material selected from the group consisting of refractory metals and nitrides of refractory metals, such as Ta or a nitride thereof.

In the first, second, and third wiring grooves 11a, 11b, and 11c, first, second, and third wiring layers 8, 10, and 13 are buried, respectively. The first, second, and third wiring layers 8, 10, and 13 are electrically connected to the conductive layer 5, the wiring pattern portion 6b of the conductive layer 6, and the wiring pattern portion 6c of the conductive layer 6, through the in-groove barrier layers 7, 9, and 12, respectively. The first to third wiring layers 8, 10, and 13 are made of copper, though the wiring material can be selected from the group consisting of copper, aluminum and an alloy containing copper or aluminum as the main component.

The first to third wiring layers 8, 10, and 13 mutually have the same film thickness, which is larger than that of the conductive layers 5 and 6 and not larger than about 1.5 $\mu$m. In order to further increase the thickness of the first to third wiring layers 8, 10, and 13, the thickness of the upper inter-level insulating film thickness 11 on the fuse Fu has to be larger than 1.5 $\mu$m. In this case, a laser beam for melting, cutting, and blowing the fuse needs to have a considerably large energy, thereby possibly damaging the semiconductor substrate. On the other hand, in order to avoid having to increase the energy of the laser beam, it is necessary to form an opening in the upper inter-level insulating film thickness 11 to correspond to the fuse Fu, thereby complicating the manufacturing steps.

FIGS. 2 to 12 are sectional views showing steps of a method of manufacturing a semiconductor device according to the first embodiment. FIGS. 2 to 12 include a portion showing a via-structure (not shown in FIG. 1), connecting wiring layers to each other.

Figure 2:
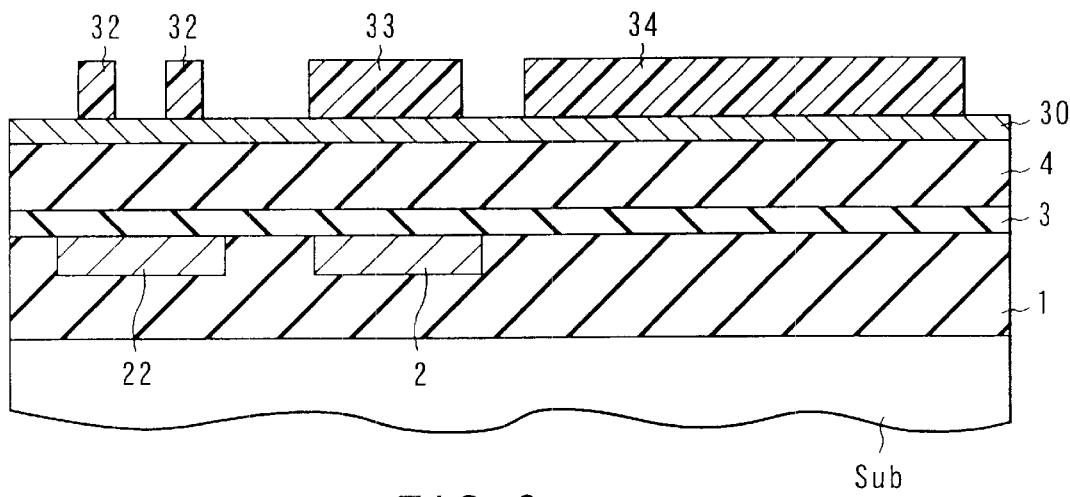
FIGS. 2, 3, 4, 5, 6, 7, 8, 9, 10, 11, and 12 are sectional views showing steps of a method of manufacturing a semiconductor device according to the first embodiment.

First, as shown in FIG. 2, a lower inter-level insulating film 1 is deposited on a silicon substrate Sub, in which an active portion (not shown) of a semiconductor device has been fabricated. Lower wiring layers 2 and 22, which are made of, e.g., copper and to be used as ordinary signal lines, are formed in the surface of the lower inter-level insulating film 1. The lower wiring layers 2 and 22 mutually have the same film thickness, which is about 0.5 $\mu$m.

Then, an insulating inter-level barrier layer 3 made of, e.g., silicon nitride is deposited on the lower inter-level insulating film 1 and the lower wiring layers 2 and 22. The inter-level barrier layer 3 functions as an etching stopper and a barrier for the lower wiring layers 2 and 22. A middle inter-level insulating film 4 is deposited on the inter-level barrier layer 3, to a thickness corresponding to the depth of a via-hole to be formed in a later step. A conductive film 30, which is made of a material selected from the group consisting of refractory metals and nitrides of refractory metals, such as Ta or a nitride thereof, is further deposited on the middle inter-level insulating film 4.

Then, a resist pattern is formed on the conductive film 30, in order to perform patterning of the conductive film 30 by photo-lithography. The widths of pattern portions 32, 33, and 34 are set to cover those portions of the conductive film 30, which correspond to conductive layers 24, 5, and 6 (see FIG. 3), in consideration of plus conversion errors.

The pattern portion 32 for forming a via-hole 40 (see FIG. 7) has an opening diameter of about 0.5 $\mu$m. The distance between the pattern portions 32 and 33, which almost corresponds to the inter-wiring distance, is about 1 $\mu$m. The width of the pattern portion 33, which almost corresponds to the wiring width, is about 1 $\mu$m.

Figure 3:
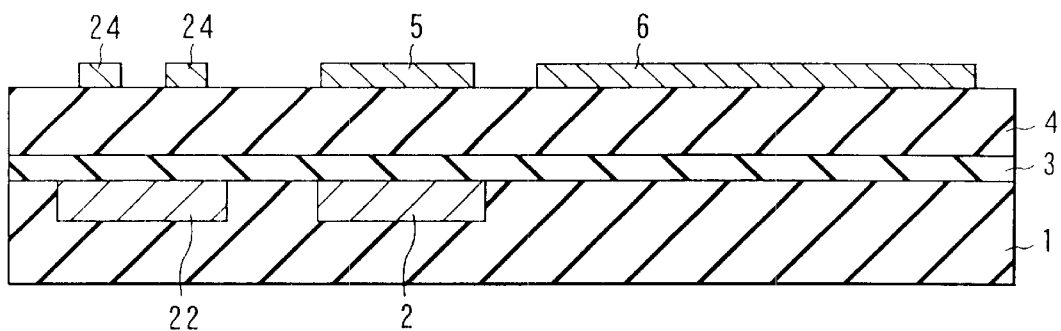
Figure 4:
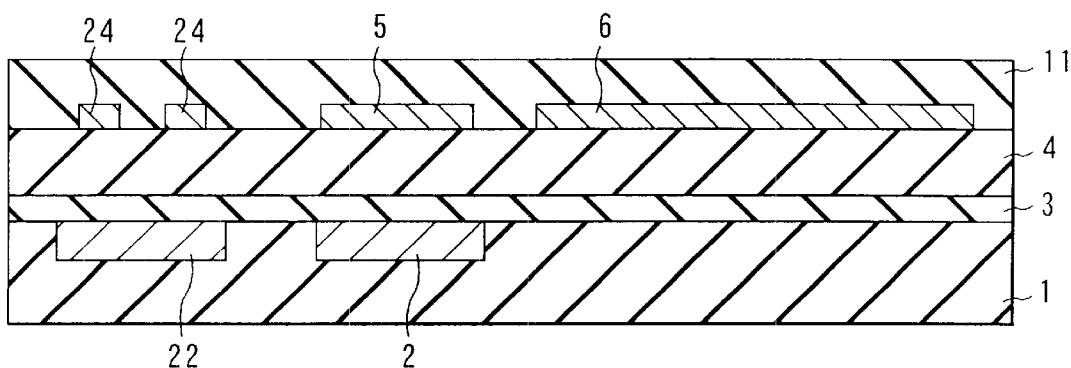

Then, as shown in FIG. 3, the conductive film 30 is etched, with the resist pattern 32 to 34 used as a mask, to form the conductive layers 5, 6, and 24. The resist pattern 32 to 34 is then removed. Then, as shown in FIG. 4, an upper inter-level insulating film 11 is deposited on the middle inter-level insulating film 4 and the conductive layers 5, 6, and 24, to a thickness corresponding to the thickness of wiring layers 8, 10, 13, and 14 (see FIG. 12).

Figure 5:
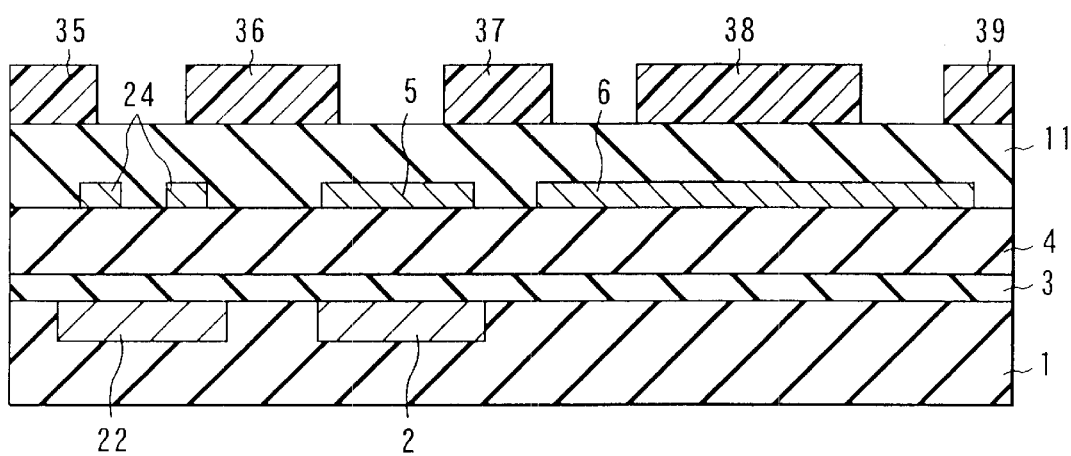
Figure 6:
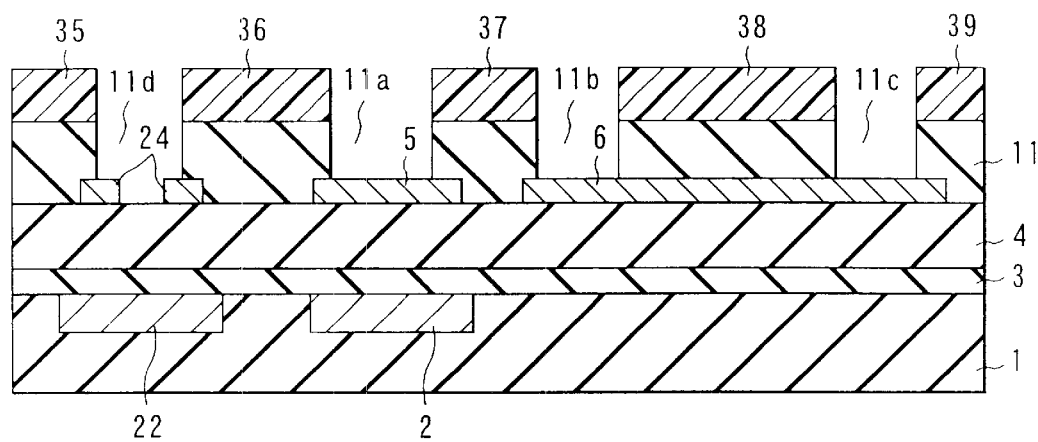

Then, as shown in FIG. 5, a resist pattern is formed on the upper inter-level insulating film 11, in order to perform patterning of the upper inter-level insulating film 11 by photo-lithography. The pattern portions 35, 36, 37, 38, and 39 are formed such that portions corresponding to wiring grooves 11a, 11b, 11c, and 11d (see FIG. 6) are opened. Then, as shown in FIG. 6, the upper inter-level insulating film 11 is etched, with the resist pattern 35 to 39 used as a mask, to form the wiring grooves 11a, 11b, 11c, and 11d. At this time, etching conditions are employed to obtain a sufficient etching selectivity of the upper inter-level insulating film 11 relative to the conductive layers 5, 6, and 24.

Figure 7:
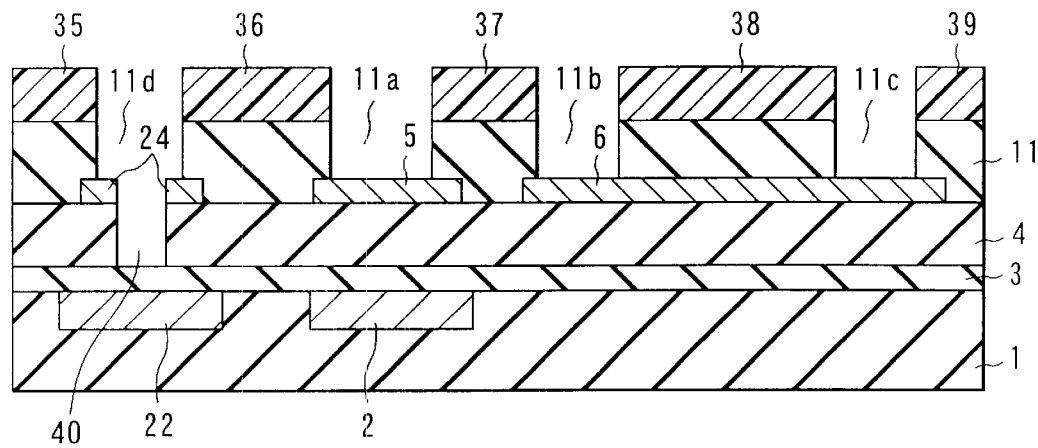
Figure 8:
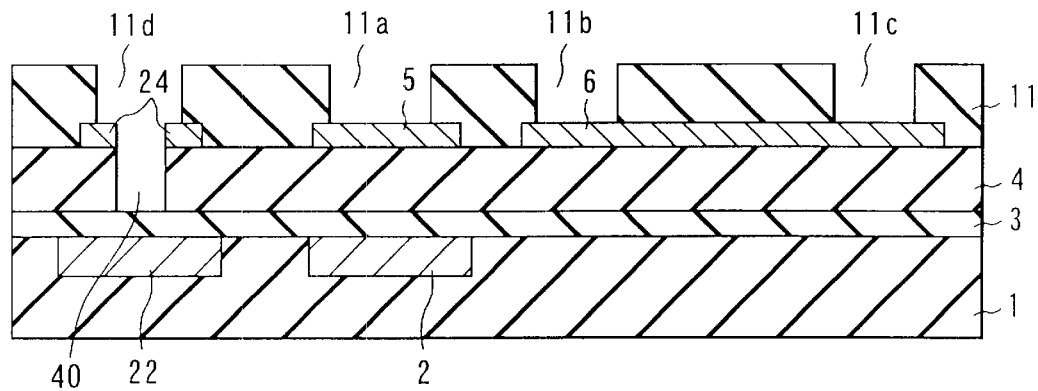
Figure 9:
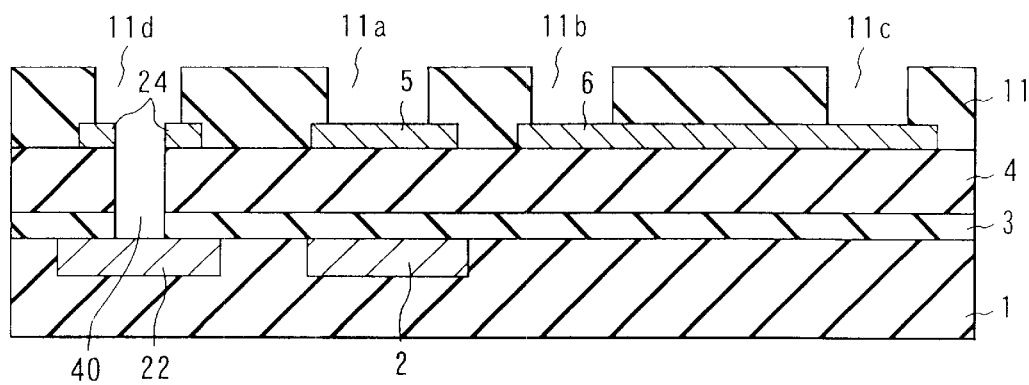

Then, as shown in FIG. 7, an over-etching is performed with the resist pattern 35 to 39 used as a mask to remove a portion of the middle inter-level insulating film 4 through the opening of the conductive layer 24 at the bottom of the wiring groove 11d so as to form a via-hole 40 reaching the inter-level barrier layer 3 in the middle inter-level insulating film 4. As shown in FIG. 8, the resist pattern 35 to 39 is then removed. Then, as shown in FIG. 9, that portion of the inter-level barrier layer 3, which is exposed at the bottom of the via-hole 40, is removed by anisotropic etching to expose the surface of the lower wiring layer 22.

Figure 10:
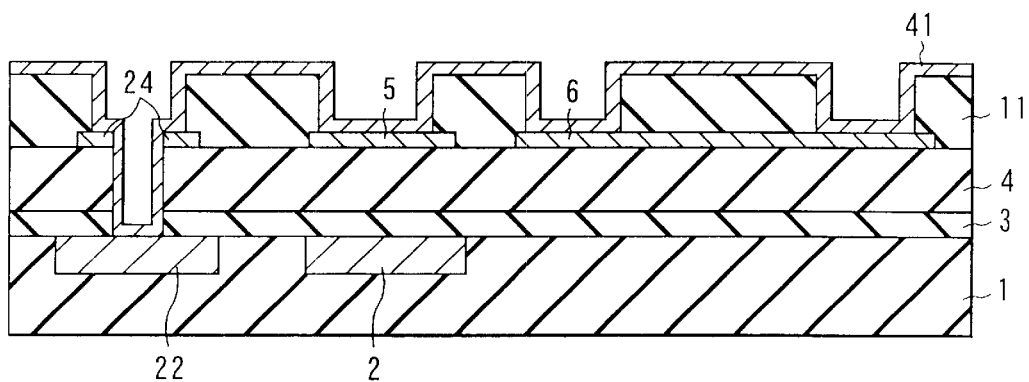
Figure 11:
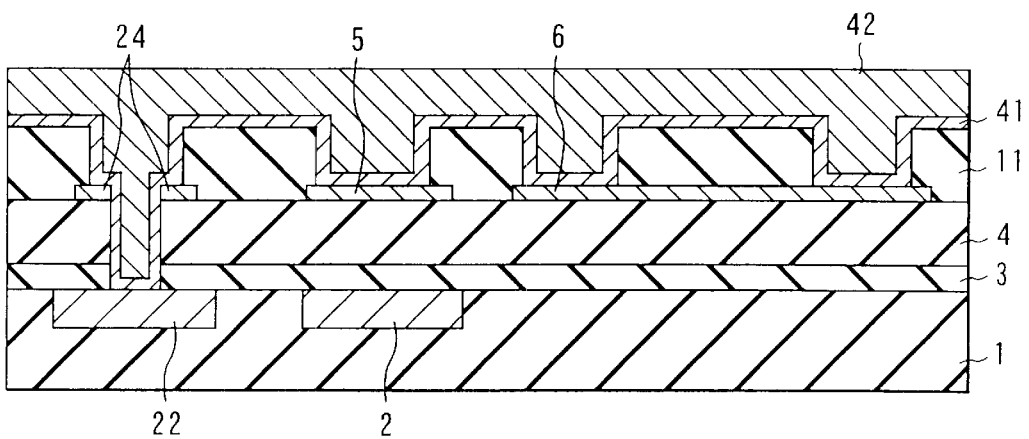

Then, as shown in FIG. 10, a barrier film 41, which is made of a material selected from the group consisting of refractory metals and nitrides of refractory metals, such as Ta or a nitride thereof, is deposited to cover the entire region including the via-hole 40 and the wiring grooves 11a, 11b, 11c, and 11d. Then, as shown in FIG. 11, a wiring film 42 (or a metal damascene wiring material film), which is made of, e.g., copper, is deposited on the barrier film 41, to fill the via-hole 40 and the wiring grooves 11a, 11b, 11c, and 11d.

Figure 12:
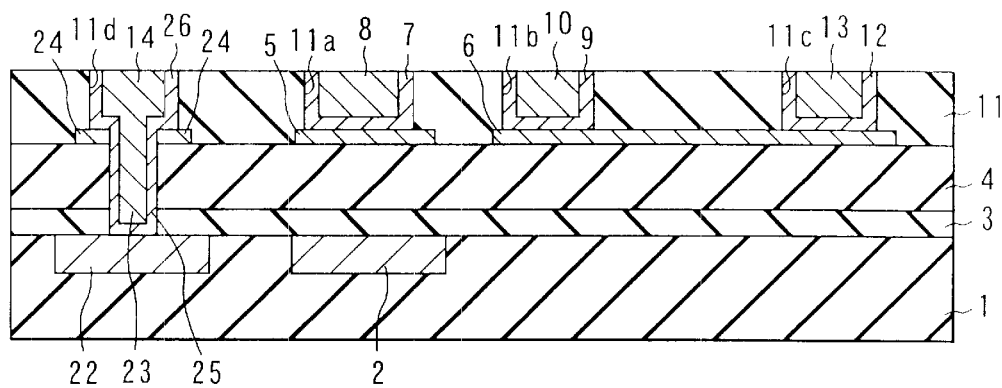

Then, as shown in FIG. 12, the resultant structure with the wiring film 42 thus formed is planarized by CMP from above to remove the wiring film 42 and the barrier film 41 until the upper inter-level insulating film 11 is exposed. With this operation, a via-plug 23, and wiring layers 8, 10, 13, and 14 are left in the via-hole 40 and the wiring grooves 11a, 11b, 11c, and 11d, respectively. Furthermore, an in-hole barrier layer 25, and in-groove barrier layers 7, 9, 12, and 26 intervene between the via-plug 23 and the wiring layers 8, 10, 13, and 14, and the inter-level insulating films 4 and 11 therearound. The via-plug 23 is integrally formed with the wiring layer 14. The in-hole barrier layer 25 is integrally formed with the in-groove barrier layer 26 within the wiring groove 11d.

The barrier layers 25, 7, 9, 12, and 26 function to prevent the metal material, such as copper or aluminum, of the via-plug 23 and the wiring layers 8, 10, 13, and 14 formed therein from diffusing. For this reason, where the metal material of the wiring layer is copper, the material of the barrier layers is preferably a refractory metal, such as tantalum or tantalum nitride. Where the metal material of the wiring layer is aluminum, the material of the barrier layers is preferably a refractory metal, such as titanium, titanium nitride, or niobium. Furthermore, the barrier layers are preferably conductive, so that they are utilized as part of the wiring.

As has been explained with reference to FIGS. 1 to 12, according to the first embodiment, there is provided a semiconductor device including a thin fuse or wiring layer and a thick wiring layer, and a method of manufacturing the device with a reduced number of steps. Since the redundancy fuse is formed of a thin conductive layer 6 made of a refractory metal or its nitride, it is easy to melt and cut the fuse, with the cut face thereof being highly corrosion-resistant. While providing such a fuse, it is possible to increase the thickness of wiring layers, such as a power line and a ground line, which are required to have a low resistance.

A wiring layer preferably thick, such as a power line, can be made thicker by suitably increasing its depth, to reduce its resistance. Accordingly, this wiring layer can be disposed at an arbitrary position without reference to the position of the lower wiring. Furthermore, in order to reduce the resistance, the wiring layer does not have to be increased in width, thereby maintaining a high degree of integration. Since the material of, e.g., a power line is selected without reference to the fuse, the power line can be made of copper, which has a low resistivity.

In the manufacturing method according to the first embodiment, since the via-hole is formed without employing a plurality of masks, but utilizing an over-etching, the manufacturing steps are simplified.

Second Embodiment

Figure 13:
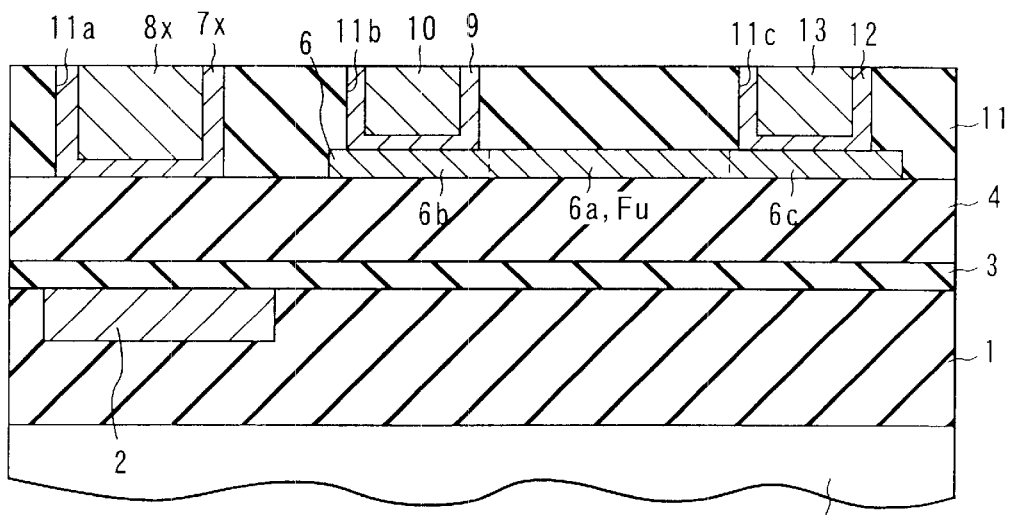
FIG. 13 is a sectional view showing a semiconductor device according to a second embodiment of the present invention.

FIG. 13 is a sectional view showing a semiconductor device according to a second embodiment of the present invention. This embodiment differs from the first embodiment in the structure of a first wiring layer 8x and the forming method of a via-hole.

As shown in FIG. 13, also in this embodiment, a lower inter-level insulating film 1 is formed on a semiconductor substrate Sub. A lower wiring layer 2 made of copper or aluminum is formed on the lower inter-level insulating film 1. An insulating inter-level barrier layer 3 made of, e.g., silicon nitride and to be used as an etching stopper is formed on the lower wiring layer 2 and the lower inter-level insulating film 1. A middle inter-level insulating film 4 is formed on the inter-level barrier layer 3. A conductive layer 6 is formed on the middle inter-level insulating film 4. An upper inter-level insulating film 11 is formed on the middle inter-level insulating film 4 and the conductive layer 6.

As in the first embodiment, the conductive layer 6 has a thickness of from about 0.02 to 0.05 $\mu$m, which is smaller than that of the lower wiring layer 2. The conductive layer 6 is made of a material selected from the group consisting of refractory metals and nitrides of refractory metals, such as Ta or a nitride thereof. The conductive layer 6 has a bridge portion 6a forming a fuse Fu, and two wiring pattern portions 6b and 6c connected to each other via the bridge portion 6a. The fuse Fu is arranged such that it is melted and cut by a laser beam radiated through the upper inter-level insulating film 11.

In the upper inter-level insulating film 11, first, second, and third wiring grooves 11a, 11b, and 11c are formed to be distant from each other. The first, second, and third wiring grooves 11a, 11b, and 11c use, as their bottoms, the middle inter-level insulating film 4, the wiring pattern portion 6b of the conductive layer 6, and the wiring pattern portion 6c of the conductive layer 6, respectively. The side surfaces of the first, second, and third wiring grooves 11a, 11b, and 11c are covered with in-groove barrier layers 7x, 9, and 12, respectively, which are thinner than the conductive layer 6. The in-groove barrier layers 7x, 9, and 12 are made of a material selected from the group consisting of refractory metals and nitrides of refractory metals, such as Ta or a nitride thereof.

In the first, second, and third wiring grooves 11a, 11b, and 11c, first, second, and third wiring layers 8x, 10, and 13 are buried, respectively. The second and third wiring layers 10 and 13 are electrically connected to the wiring pattern portion 6b of the conductive layer 6, and the wiring pattern portion 6c of the conductive layer 6, through the in-groove barrier layers 9 and 12, respectively.

The second and third wiring layers 10 and 13 mutually have the same film thickness, which is larger than that of the conductive layers 6 and not larger than about 1.5 μm. The first wiring layer 8x has a thickness slightly larger than that of the second and third wiring layers 10 and 13.

FIGS. 14 to 25 are sectional views showing steps of a method of manufacturing a semiconductor device according to the second embodiment. FIGS. 14 to 25 include a portion showing a via-structure (not shown in FIG. 13), connecting wiring layers to each other.

Figure 14:
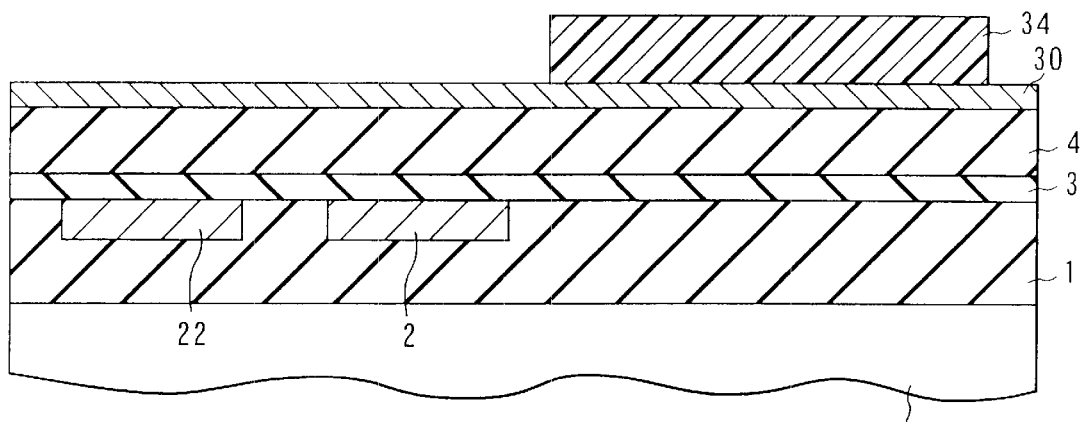
FIGS. 14, 15, 16, 17, 18, 19, 20, 21, 22, 23, 24, and 25 are sectional views showing steps of a method of manufacturing a semiconductor device according to the second embodiment.

First, as shown in FIG. 14, a lower inter-level insulating film 1 is deposited on a silicon substrate Sub, in which an active portion (not shown) of a semiconductor device has been fabricated. Lower wiring layers 2 and 22, which are made of, e.g., copper and to be used as ordinary signal lines, are formed in the surface of the lower inter-level insulating film 1.

Then, an insulating inter-level barrier layer 3 made of, e.g., silicon nitride is deposited on the lower inter-level insulating film 1 and the lower wiring layers 2 and 22. A middle inter-level insulating film 4 is deposited on the inter-level barrier layer 3, to a thickness corresponding to the depth of a via-hole to be formed in a later step. A conductive film 30 is further deposited on the middle inter-level insulating film 4.

Then, a resist pattern 34 is formed on the conductive film 30, in order to perform patterning of the conductive film 30 by photo-lithography. The width of the resist pattern 34 is set to cover that portion of the conductive film 30, which corresponds to a conductive layer 6 (see FIG. 15), in consideration of plus conversion errors.

Figure 15:
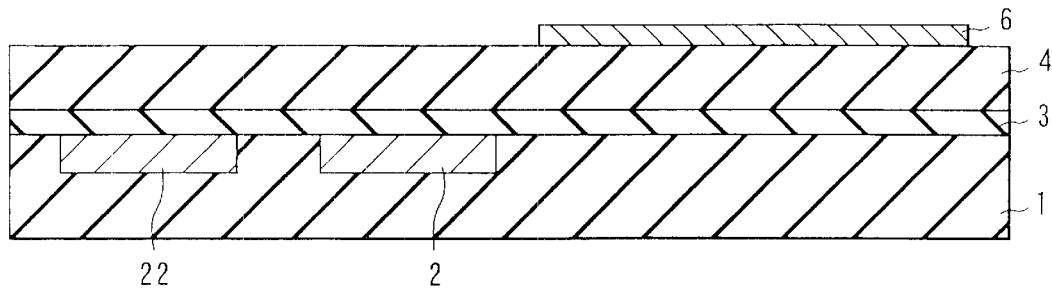
Figure 16:
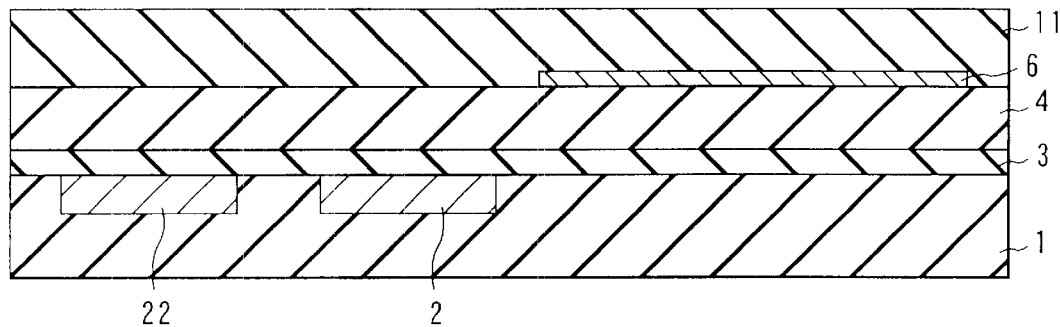

Then, as shown in FIG. 15, the conductive film 30 is etched, with the resist pattern 34 used as a mask, to form the conductive layer 6. The resist pattern 34 is then removed. Then, as shown in FIG. 16, an upper inter-level insulating film 11 is deposited on the middle inter-level insulating film 4 and the conductive layer 6, to a thickness corresponding to the thickness of wiring layers 8x, 10, 13, and 14 (see FIG. 25).

Figure 17:
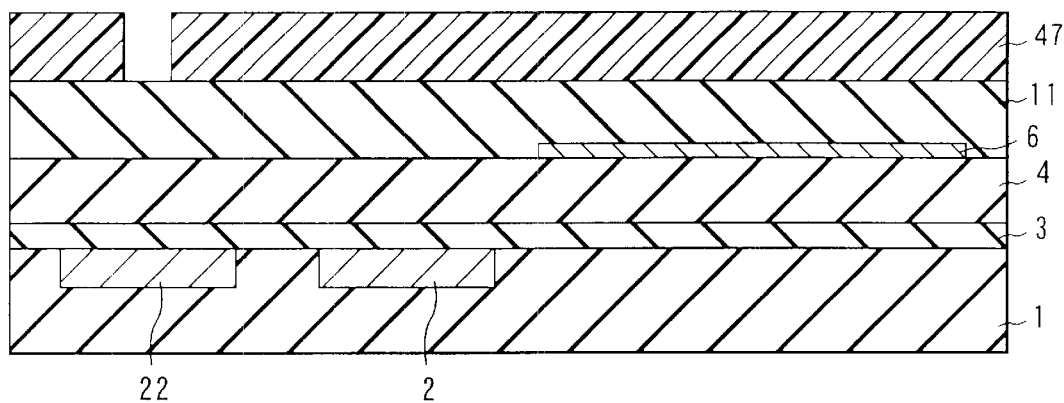
Figure 18:
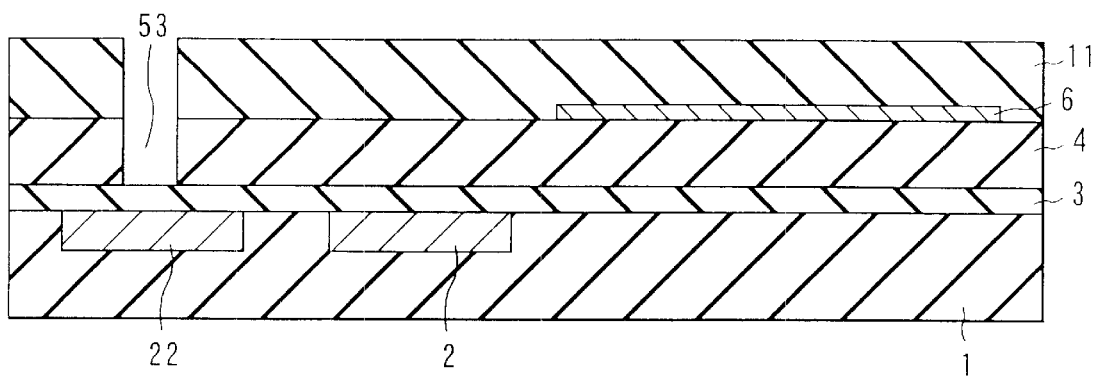

Then, as shown in FIG. 17, a resist pattern 47 is formed on the upper inter-level insulating film 11, in order to perform patterning of the upper inter-level insulating film 11 and the middle inter-level insulating film 4 by photo-lithography. The resist pattern 47 is formed such that a portion corresponding to a via-hole 53 (see FIG. 22) is opened. The opening has a diameter of about 0.5 μm. Then, as shown in FIG. 18, the upper inter-level insulating film 11 and the middle inter-level insulating film 4 are etched, with the resist pattern 47 used as a mask, to form the via-hole 53 reaching the inter-level barrier layer 3. At this time, etching conditions are employed to obtain a sufficient etching selectivity of the upper inter-level insulating film 11 and the middle inter-level insulating film 4 relative to the inter-level barrier layer 3. The resist pattern 47 is then removed.

Figure 19:
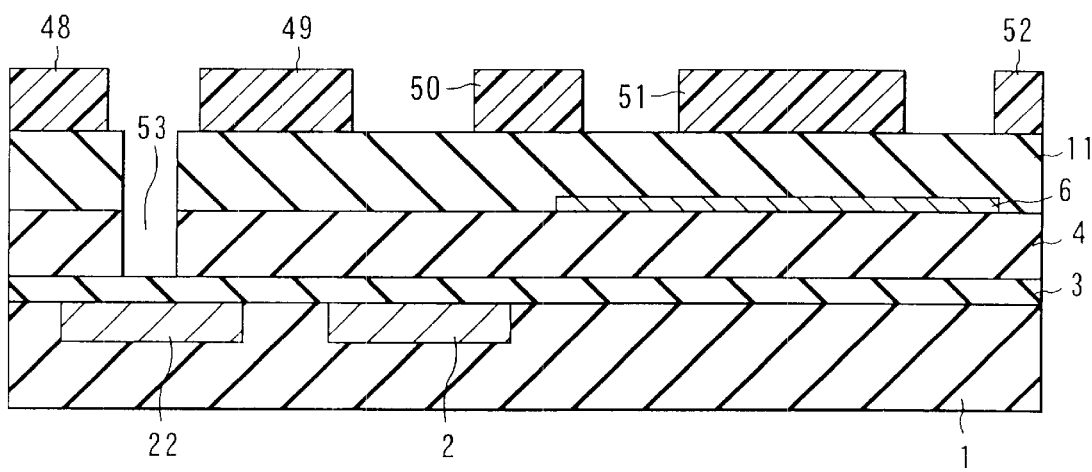
Figure 20:
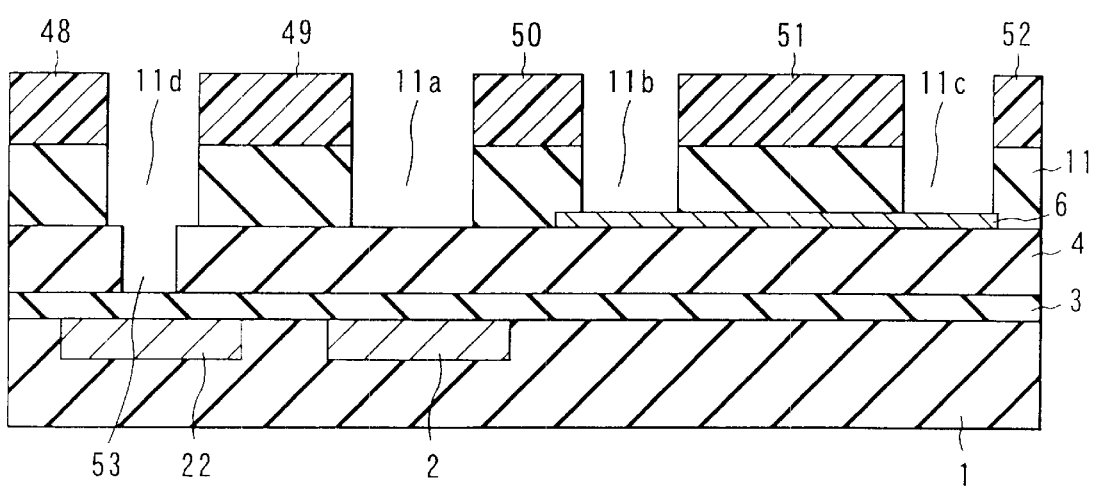

Then, as shown in FIG. 19, a resist pattern is formed on the upper inter-level insulating film 11, in order to perform patterning of the upper inter-level insulating film 11 by photo-lithography. The pattern portions 48, 49, 50, 51, and 52 are formed such that portions corresponding to wiring grooves 11a, 11b, 11c, and 11d (see FIG. 20) are opened. The width of the pattern portion 49, which almost corresponds to the inter-wiring distance, is about 1 μm. Then, as shown in FIG. 20, the upper inter-level insulating film 11 is etched, with the resist pattern 48 to 52 used as a mask, to form the wiring grooves 11a, 11b, 11c, and 11d. The wiring groove 11d communicates with the via-hole 53. At this time, etching conditions are employed to obtain a sufficient etching selectivity of the upper inter-level insulating film 11 relative to the inter-level barrier layer 3 and the conductive layer 6.

Figure 21:
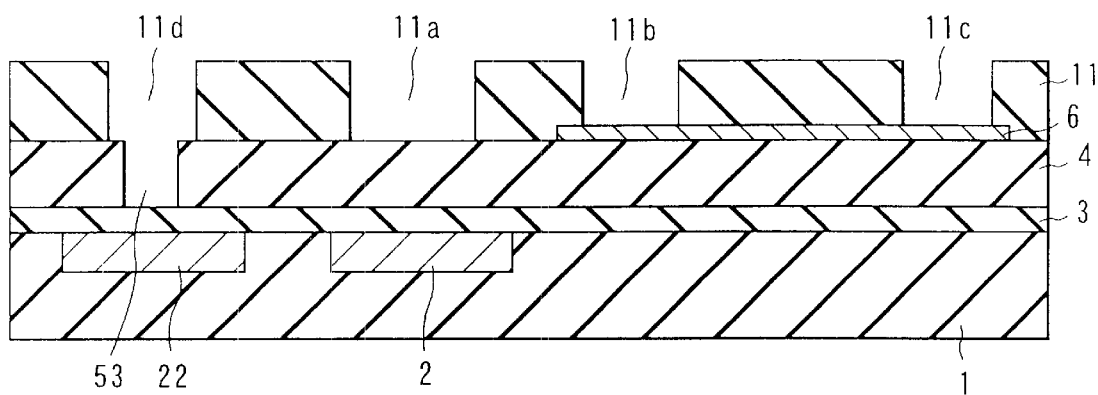
Figure 22:
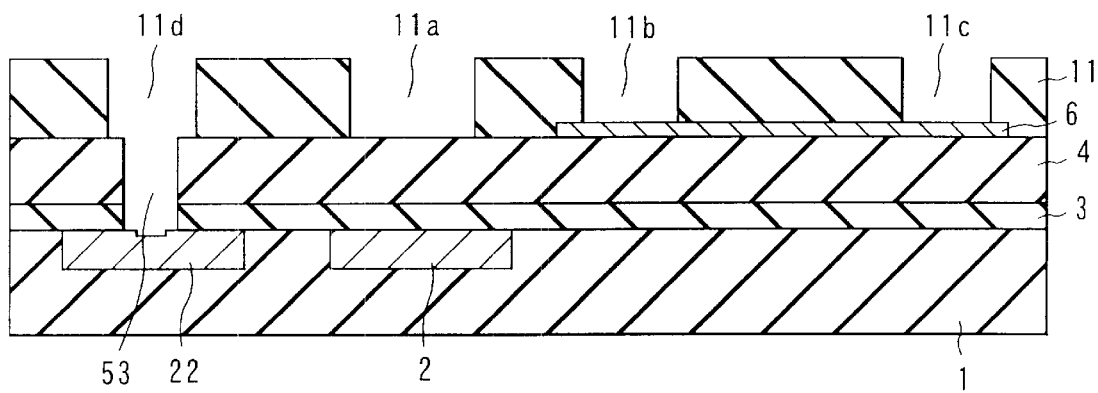

Then, as shown in FIG. 21, the resist pattern 48 to 52 is removed. Then, as shown in FIG. 22, that portion of the inter-level barrier layer 3, which is exposed at the bottom of the via-hole 53, is removed by anisotropic etching to expose the surface of the lower wiring layer 22.

Figure 23:
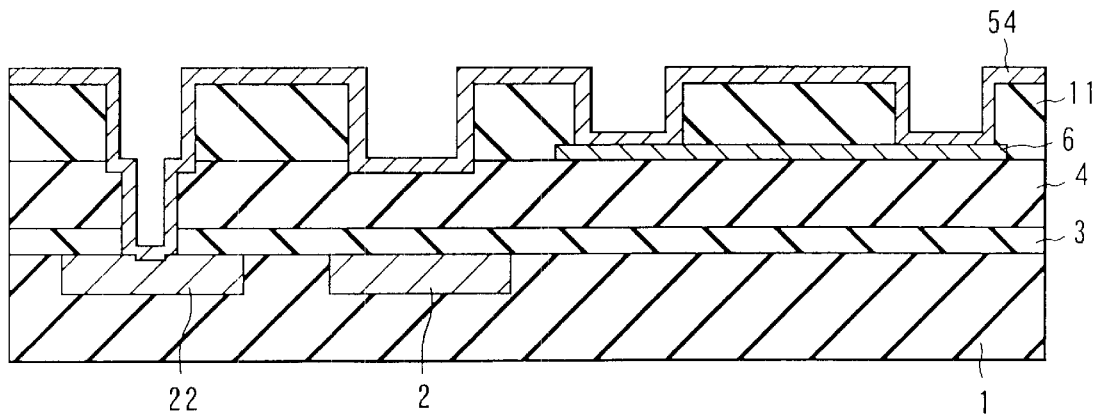
Figure 24:
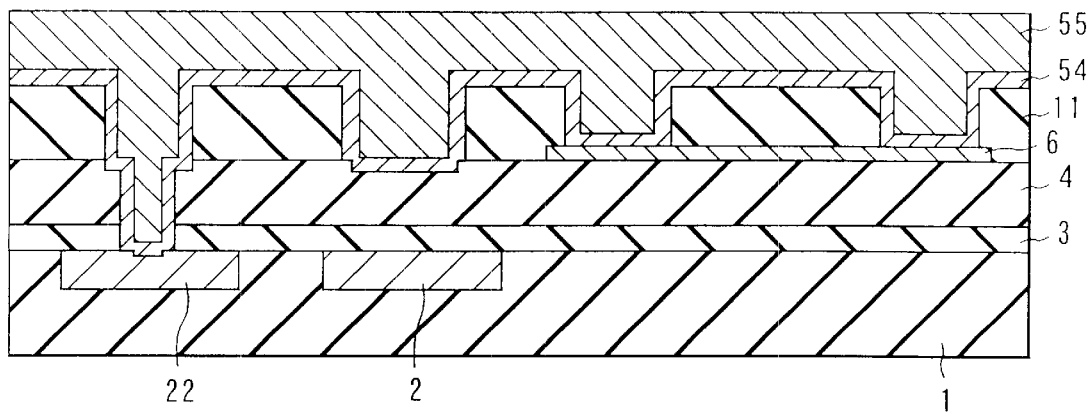

Then, as shown in FIG. 23, a barrier film 54 which is made of a material selected from the group consisting of refractory metals and nitrides of refractory metals, such as Ta or a nitride thereof, is deposited to cover the entire region including the via-hole 53 and the wiring grooves 11a, 11b, 11c, and 11d. Then, as shown in FIG. 24, a wiring film 55 (or a metal damascene wiring material film), which is made of, e.g., copper, is deposited on the barrier film 54, to fill the via-hole 53 and the wiring grooves 11a, 11b, 11c, and 11d.

Figure 25:
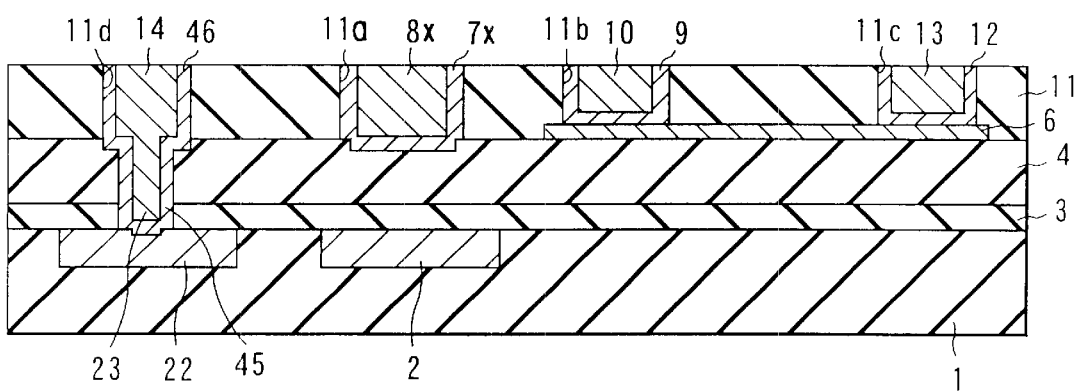

Then, as shown in FIG. 25, the resultant structure with the wiring film 55 thus formed is planarized by CMP from above to remove the wiring film 55 and the barrier film 54 until the upper inter-level insulating film 11 is exposed. With this operation, a via-plug 23 and wiring layers 8x, 10, 13, and 14 are left in the via-hole 53 and the wiring grooves 11a, 11b, 11c, and 11d, respectively. Furthermore, an in-hole barrier layer 45, and in-groove barrier layers 7x, 9, 12, and 46 intervene between the via-plug 23 and the wiring layers 8x, 10, 13, and 14, and the inter-level insulating films 4 and 11 therearound. The via-plug 23 is integrally formed with the wiring layer 14. The in-hole barrier layer 45 is integrally formed with the in-groove barrier layer 46 within the wiring groove 11d.

The barrier layers 45, 7x, 9, 12, and 46 function to prevent the metal material, such as copper or aluminum, of the via-plug 23 and the wiring layers 8x, 10, 13, and 14 formed therein from diffusing. For this reason, where the metal material of the wiring layer is copper, the material of the barrier layers is preferably a refractory metal, such as tantalum or tantalum nitride. Where the metal material of the wiring layer is aluminum, the material of the barrier layers is preferably a refractory metal, such as titanium, titanium nitride, or niobium. Furthermore, the barrier layers are preferably conductive, so that they are utilized as part of the wiring.

As has been explained with reference to FIGS. 13 to 25, the second embodiment provides similar effects to those of the first embodiment. In the second embodiment, the number of steps is higher than that of the first embodiment, but no conductive layer 5 is disposed under the first wiring layer 8, thereby allowing the spaces between the wiring layers 14, 8, and 10 to be narrower, to achieve further downsizing.

Third Embodiment

Figure 26:
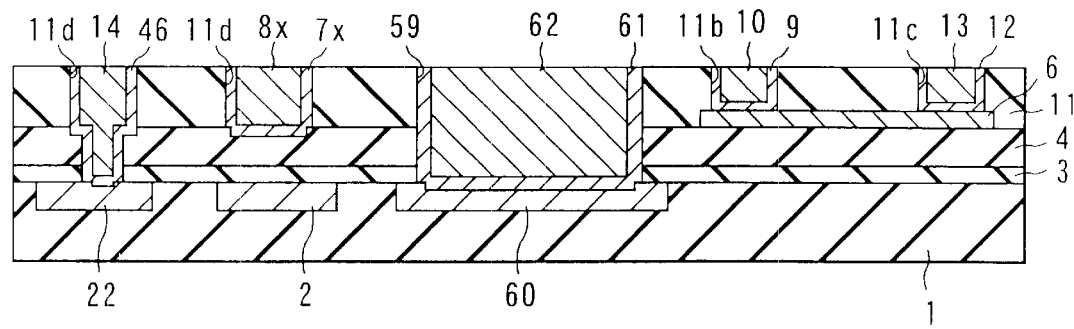
FIG. 26 is a sectional view showing a semiconductor device according to a third embodiment of the present invention.

FIG. 26 is a sectional view showing a semiconductor device according to a third embodiment of the present invention. In addition to the structure of the second embodiment, this embodiment further includes a thick wiring layer having a thickness corresponding to the sum of those of an ordinary wiring layer and a via-plug.

As shown in FIG. 26, lower wiring layers 2, 22, and 60 made of copper or aluminum are formed on a lower inter-level insulating film 1 formed on a semiconductor substrate Sub. An inter-level barrier layer 3, a middle inter-level insulating film 4, and an upper inter-level insulating film 11 are formed on the lower inter-level insulating film 1 and the lower wiring layers 2, 22, and 60. A wiring trench 59 is formed to penetrate the upper inter-level insulating film 11 and the middle inter-level insulating film 4. The side surface of the wiring trench 59 is covered with an in-trench barrier layer 61, which is derived from a barrier film in common with barrier layers 45, 7x, 9, 12, and 46 in the other wiring grooves. A thick wiring layer 62 is buried in the wiring trench 59.

The barrier layer 61 functions to prevent the metal material, such as copper or aluminum, of the wiring layer 62 formed therein from diffusing. For this reason, where the metal material of the wiring layer is copper, the material of the barrier layer is preferably a refractory metal, such as tantalum or tantalum nitride. Where the metal material of the wiring layer is aluminum, the material of the barrier layer is preferably a refractory metal, such as titanium, titanium nitride, or niobium. Furthermore, the barrier layer is preferably conductive, so that it is utilized as part of the wiring. The wiring layer 62 is made of copper, though the wiring material can be selected from the group consisting of copper, aluminum and an alloy containing copper or aluminum as the main component.

FIGS. 27 to 37 are sectional views showing steps of a method of manufacturing a semiconductor device according to the third embodiment.

Figure 27:
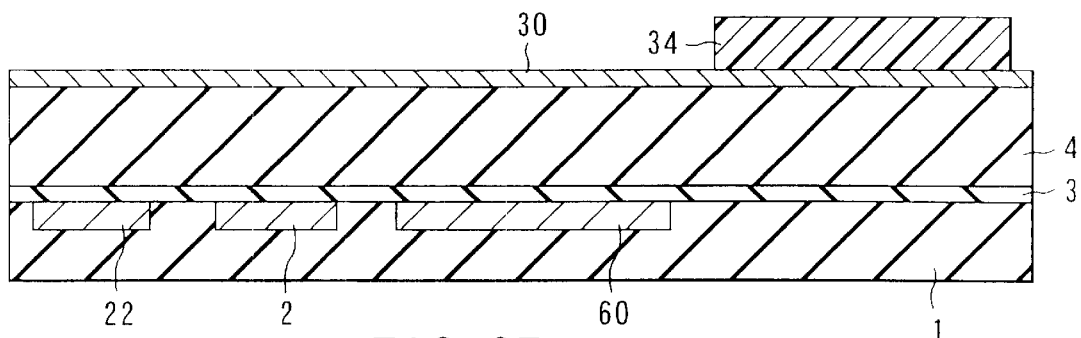
FIGS. 27, 28, 29, 30, 31, 32, 32, 33, 34, 35, 36, and 37 are sectional views showing steps of a method of manufacturing a semiconductor device according to the third embodiment.

First, as shown in FIG. 27, a lower inter-level insulating film 1 is deposited on a silicon substrate Sub, in which an active portion (not shown) of a semiconductor device has been fabricated. Lower wiring layers 2, 22, and 60, which are made of, e.g., copper and to be used as ordinary signal lines, are formed in the surface of the lower inter-level insulating film 1.

Then, an insulating inter-level barrier layer 3 made of, e.g., silicon nitride is deposited on the lower inter-level insulating film 1 and the lower wiring layers 2, 22, and 60. A middle inter-level insulating film 4 is deposited on the inter-level barrier layer 3, to a thickness corresponding to the depth of a via-hole to be formed in a later step. A conductive film 30 is further deposited on the middle inter-level insulating film 4. Then, a resist pattern 34 is formed on the conductive film 30, in order to perform patterning of the conductive film 30 by photo-lithography.

Figure 28:
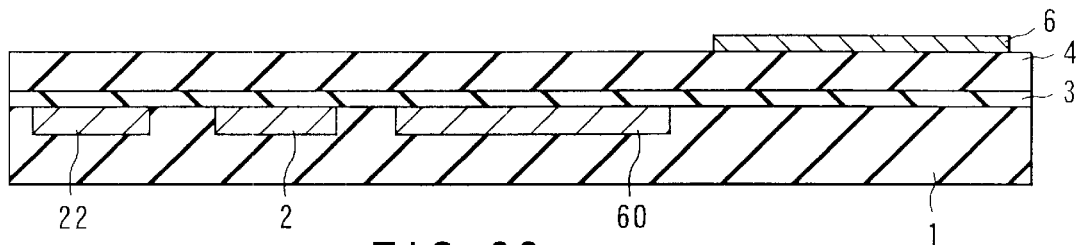
Figure 29:
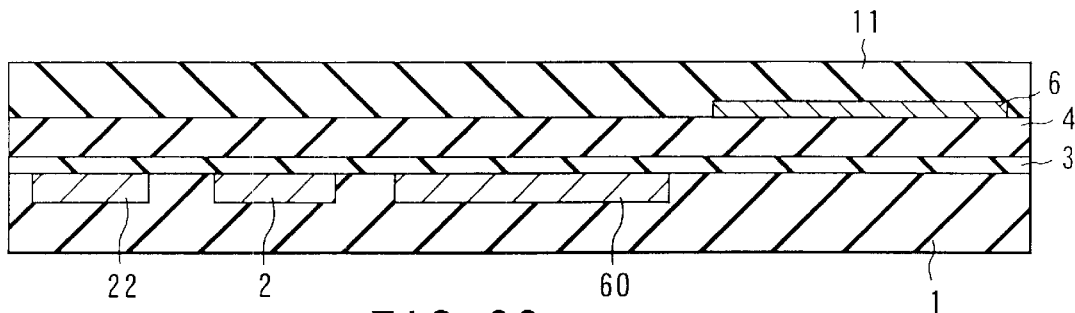

Then, as shown in FIG. 28, the conductive film 30 is etched, with the resist pattern 34 used as a mask, to form the conductive layer 6. The resist pattern 34 is then removed. Then, as shown in FIG. 29, an upper inter-level insulating film 11 is deposited on the middle inter-level insulating film 4 and the conductive layer 6, to a thickness corresponding to the thickness of wiring layers 8x, 10, 13, and 14 (see FIG. 26).

Figure 30:
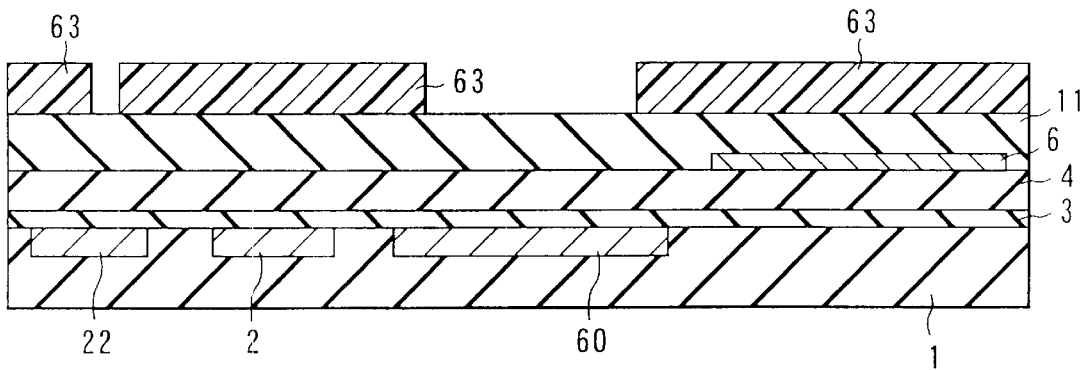
Figure 31:
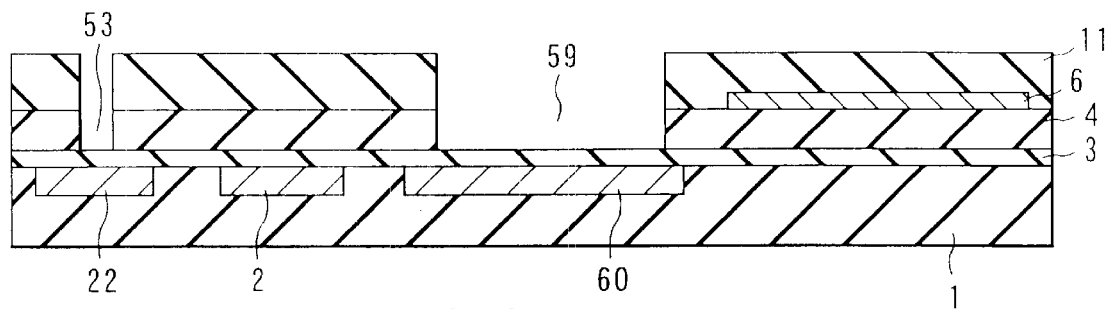

Then, as shown in FIG. 30, a resist pattern 63 is formed on the upper inter-level insulating film 11, in order to perform patterning of the upper inter-level insulating film 11 and the middle inter-level insulating film 4 by photo-lithography. The resist pattern 63 is formed such that portions corresponding to a via-hole 53 (see FIG. 35) and a wiring trench 59 (see FIG. 35) are opened. The opening for the via-hole 53 has a diameter of about 0.5 $\mu$m. Then, as shown in FIG. 31, the upper inter-level insulating film 11 and the middle inter-level insulating film 4 are etched, with the resist pattern 63 used as a mask, to form the via-hole 53 and the wiring trench 59 reaching the inter-level barrier layer 3. At this time, etching conditions are employed to obtain a sufficient etching selectivity of the upper inter-level insulating film 11 and the middle inter-level insulating film 4 relative to the inter-level barrier layer 3. The resist pattern 63 is then removed.

Figure 32:
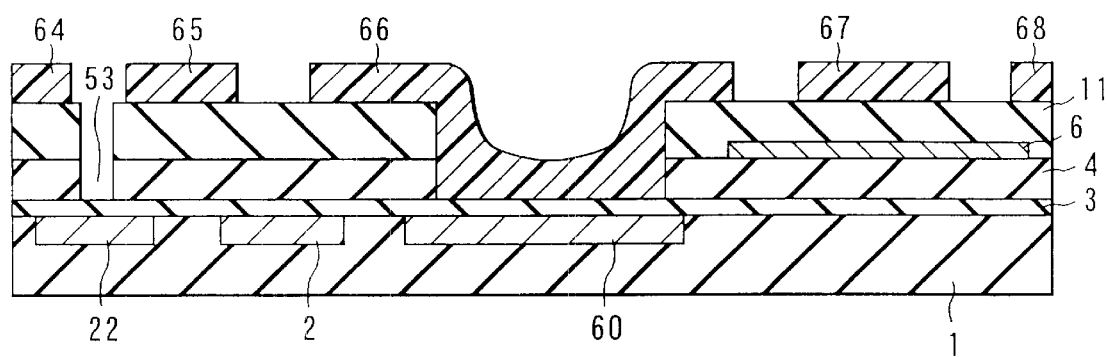
Figure 33:
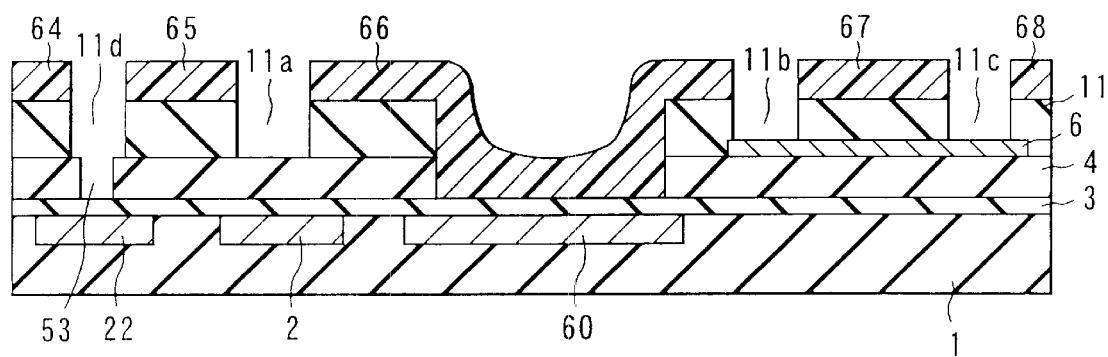

Then, as shown in FIG. 32, a resist pattern is formed on the upper inter-level insulating film 11, in order to perform patterning of the upper inter-level insulating film 11 by photo-lithography. The pattern portions 64, 65, 66, 67, and 68 are formed such that portions corresponding to wiring grooves 11a, 11b, 11c, and 11d (see FIG. 33) are opened. The width of the pattern portion 65, which almost corresponds to the inter-wiring distance, is about 1 $\mu$m. Then, as shown in FIG. 33, the upper inter-level insulating film 11 is etched, with the resist pattern 64 to 68 used as a mask, to form the wiring grooves 11a, 11b, 11c, and 11d. The wiring groove 11d communicates with the via-hole 53. At this time, etching conditions are employed to obtain a sufficient etching selectivity of the upper inter-level insulating film 11 relative to the inter-level barrier layer 3 and the conductive layer 6.

Figure 34:
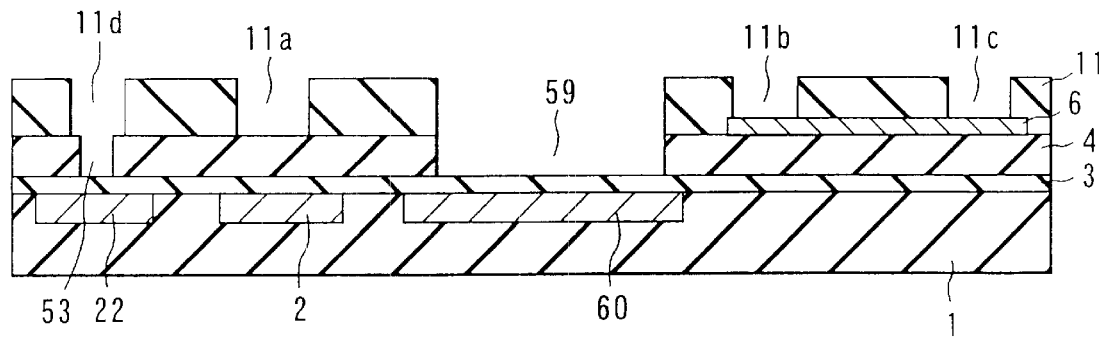
Figure 35:
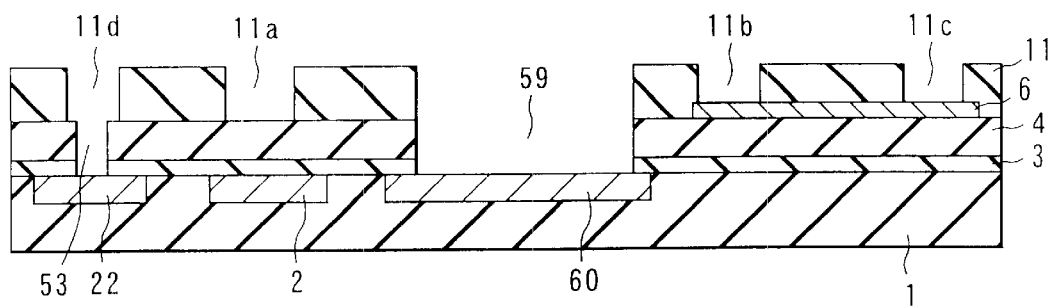

Then, as shown in FIG. 34, the resist pattern 64 to 68 is removed. Then, as shown in FIG. 35, those portions of the inter-level barrier layer 3, which are exposed at the bottoms of the via-hole 53 and the wiring trench 59, are removed by anisotropic etching to expose the surfaces of the lower wiring layers 22 and 60.

Figure 36:
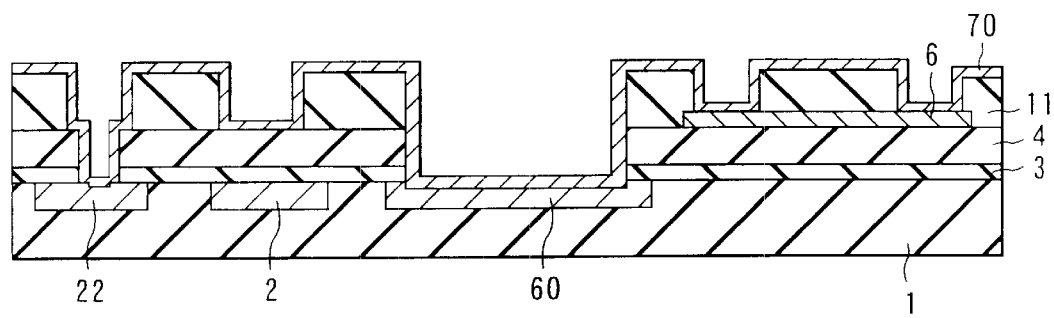
Figure 37:
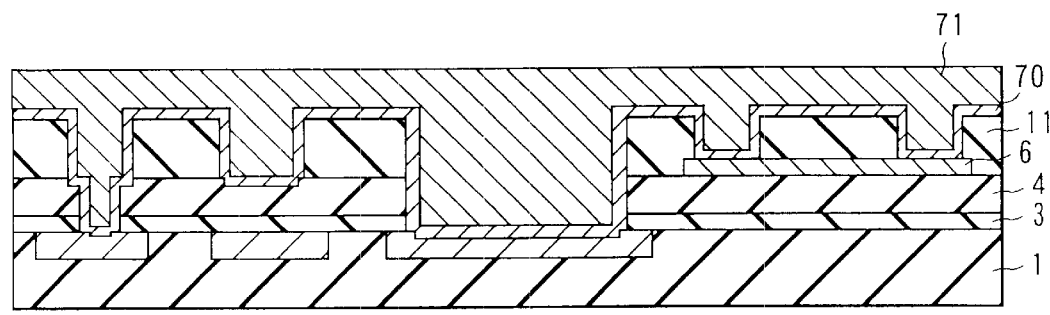

Then, as shown in FIG. 36, a barrier film 70 which is made of a material selected from the group consisting of refractory metals and nitrides of refractory metals, such as Ta or a nitride thereof, is deposited to cover the entire region including the via-hole 53, the wiring grooves 11a, 11b, 11c, and 11d, and the wiring trench 59. Then, as shown in FIG. 37, a wiring film 71 (or a metal damascene wiring material film), which is made of, e.g., copper, is deposited on the barrier film 70, to fill the via-hole 53, the wiring grooves 11a, 11b, 11c, and 11d, and the wiring trench 59.

Then, as shown in FIG. 26, the resultant structure with the wiring film 71 thus formed is planarized by CMP from above to remove the wiring film 71 and the barrier film 70 until the upper inter-level insulating film 11 is exposed. With this operation, a via-plug 23 and wiring layers 8x, 10, 13, 14, and 62 are left in the via-hole 53, the wiring grooves 11a, 11b, 11c, and 11d, and the wiring trench 59, respectively. Furthermore, an in-hole barrier layer 45, in-groove barrier layers 7x, 9, 12, and 46, and in-trench barrier layer 61 intervene between the via-plug 23 and the wiring layers 8x, 10, 13, 14, and 62, and the inter-level insulating films 4 and 11 therearound.

As has been explained with reference to FIGS. 26 to 37, the third embodiment also provides similar effects to those of the first embodiment. In the third embodiment, it is possible to form a thick wiring layer thicker than that of the first and second embodiments, while forming a thin fuse or wiring layer, without complicating the manufacturing steps. This thick wiring layer realizes a local decrease in resistance, without entailing an increase in circuit surface area, in a metal damascene wiring structure formed in the same steps. The features of the third embodiment may be applied to a structure having no lower wiring 2, 22, or 60.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:

a semiconductor substrate;

a middle inter-level insulating film disposed on or above the semiconductor substrate;

a conductive layer disposed on the middle inter-level insulating film;

an upper inter-level insulating film disposed on the middle inter-level insulating film and the conductive layer, the upper inter-level insulating film including first, second, and third wiring grooves distant from each other, the second and third wiring grooves using the conductive layer as their bottoms;

in-groove barrier layers covering side surfaces of the first, second, and third wiring grooves; and first, second, and third wiring layers buried in the first, second, and third wiring grooves, the first, second, and third wiring layers being derived from the same wiring film, the first, second, and third wiring layers having a thickness larger than that of the conductive layer, the second and third wiring layers being electrically connected to the conductive layer, wherein the conductive layer consists essentially of a material selected from the group consisting of refractory metals and nitrides of refractory metals, and comprises a bridge portion forming a fuse, and two wiring pattern portions connected to each other via the bridge portion, the wiring pattern portions forming the bottoms of the second and third wiring grooves.

2. The device according to claim 1 wherein the fuse is arranged to be melted and cut by a laser beam radiated through the upper inter-level insulating film.

3. The device according to claim 1, wherein the in-groove barrier layers consist essentially of a material selected from the group consisting of refractory metals and nitrides of refractory metals.

4. The device according to claim 1, wherein the first, second, and third wiring layers consist essentially of a material selected from the group consisting of copper, aluminum and an alloy containing copper or aluminum as a main component.

5. The device according to claim 1, further comprising a lower inter-level insulating film disposed between the semiconductor substrate and the middle inter-level insulating film, and a lower wiring layer disposed between the lower inter-level insulating film and the middle inter-level insulating film.

6. The device according to claim 5, further comprising an insulating inter-level barrier layer disposed between the lower wiring layer and the middle inter-level insulating film.

7. The device according to claim 5, further comprising a via-plug penetrating the middle inter-level insulating film to electrically connect the first wiring layer to the lower wiring layer, the via-plug being integrally formed with the first wiring layer.

8. The device according to claim 7, further comprising an in-hole barrier layer disposed between the via-plug and the middle inter-level insulating film, the in-hole barrier layer being integrally formed with the in-groove barrier layer in the first wiring groove.

9. The device according to claim 1, further comprising an additional conductive layer disposed on the middle inter-level insulating film and distant from the conductive layer, the first wiring groove using the additional conductive layer as its bottom.

10. The device according to claim 9, wherein the conductive layer and the additional conductive layer are derived from a common conductive film, and the first wiring layer has a thickness substantially the same as those of the second and third wiring layers.

11. The device according to claim 1, wherein the first wiring groove uses the middle inter-level insulating film as its bottom, and the first wiring layer has a thickness larger than those of the second and third wiring layers.

12. The device according to claim 1, wherein a wiring trench is formed in the upper inter-level insulating film and the middle inter-level insulating film and distant from the conductive layer, a side surface of the wiring trench is covered with an in-trench barrier layer, which is derived from a barrier film in common with the in-groove barrier layers, and a wiring layer is buried in the wiring trench.

13. The device according to claim 12, further comprising a lower inter-level insulating film disposed between the semiconductor substrate and the middle inter-level insulating film, and a lower wiring layer disposed between the lower inter-level insulating film and the middle inter-level insulating film, wherein the wiring trench uses the lower wiring layer as its bottom.

14. A semiconductor device comprising:

a semiconductor substrate;

a middle inter-level insulating film disposed on or above the semiconductor substrate;

a conductive layer disposed on the middle inter-level insulating film;

an upper inter-level insulating film disposed on the middle inter-level insulating film and the conductive layer, the upper inter-level insulating film including first, second, and third wiring grooves distant from each other, the second and third wiring grooves using the conductive layer as their bottoms;

in-groove barrier layers covering side surfaces of the first, second, and third wiring grooves; and first, second, and third wiring layers buried in the first, second, and third wiring grooves, the first, second, and third wiring layers being derived from the same wiring film, the first, second, and third wiring layers having a thickness larger than that of the conductive layer, the second and third wiring layers being electrically connected to the conductive layer, wherein the first wiring groove uses the middle inter-level insulating film as its bottom, and the first wiring layer has a thickness larger than those of the second and third wiring layers.

15. The device according to claim 14, wherein the conductive layer consists essentially of a material selected from the group consisting of refractory metals and nitrides of refractory metals.

16. The device according to claim 14, wherein the in-groove barrier layers consist essentially of a material selected from the group consisting of refractory metals and nitrides of refractory metals.

17. The device according to claim 14, wherein the first, second, and third wiring layers consist essentially of a material selected from the group consisting of copper, aluminum and an alloy containing copper or aluminum as a main component.

18. The device according to 14, further comprising a lower inter-level insulating film disposed between the semiconductor substrate and the middle inter-level insulating film, and a lower wiring layer disposed between the lower inter-level insulating film and the middle inter-level insulating film.

19. The device according to claim 18, further comprising an insulating inter-level barrier layer disposed between the lower wiring layer and the middle inter-level insulating film.

20. The device according to claim 18, further comprising a via-plug penetrating the middle inter-level insulating film to electrically connect the first wiring layer to the lower wiring layer, the via-plug being integrally formed with the first wiring layer.

21. The device according to claim 20, further comprising an in-hole barrier layer disposed between the via-plug and the middle inter-level insulating film, the in-hole barrier layer being integrally formed with the in-groove barrier layer in the first wiring groove.

22. The device according to claim 14, wherein a wiring trench is formed in the upper inter-level insulating film and the middle inter-level insulating film and distant from the conductive layer, a side surface of the wiring trench is covered with an in trench barrier layer, which is derived from a barrier film in common with the in-groove barrier layers, and a wiring layer is buried in the wiring trench.

23. The device according to claim 22, further comprising a lower inter-level insulating film disposed between the semiconductor substrate and the middle inter-level insulating film, and a lower wiring layer disposed between the lower inter-level insulating film and the middle inter-level insulating film, wherein the wiring trench uses the lower wiring layer as its bottom.

* * * * *

UNITED STATES PATENT AND TRADEMARK OFFICE
CERTIFICATE OF CORRECTION

PATENT NO.     : 6,624,514 B2
DATED          : September 23, 2003
INVENTOR(S)    : Kasai It is certified that error appears in the above-identified patent and that said Letters Patent is hereby corrected as shown below:

<u>Title page, Item [54] and Column 1, lines 1-2,</u>
Title should read:
-- [54]  SEMICONDUCTOR DEVICE WITH BURIED WIRING --

Signed and Sealed this

Thirtieth Day of December, 2003

JAMES E. ROGAN
*Director of the United States Patent and Trademark Office*